(12) United States Patent
Aoki

(10) Patent No.: US 6,337,241 B1
(45) Date of Patent: Jan. 8, 2002

(54) MANUFACTURING METHOD OF A SEMICONDUCTOR MEMORY DEVICE

(75) Inventor: Masami Aoki, Fishkill, NY (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/017,723

(22) Filed: Feb. 5, 1998

(30) Foreign Application Priority Data

Mar. 6, 1997 (JP) ............................................. 9-051514

(51) Int. Cl.[7] .......................................... H01L 21/8242
(52) U.S. Cl. ..................... 438/243; 438/243; 438/392
(58) Field of Search ............................... 438/249, 392, 438/243, 386, FOR 220, FOR 430

(56) References Cited

U.S. PATENT DOCUMENTS 4,597,164 A * 7/1986 Hauemann
6,034,359 A * 3/2000 Burns, Jr. et al.
6,066,526 A * 5/2000 Hakey et al.

* cited by examiner

*Primary Examiner*—George Fourson
*Assistant Examiner*—Joannie Adelle Garcia
(74) *Attorney, Agent, or Firm*—Oblon, Spivak, McClelland, Maier & Neustadt, P.C.

(57) ABSTRACT

A semiconductor memory device includes a semiconductor substrate having convex and concave portions locally formed in a surface thereof. An anti-reflection film serves as a first mask member and is formed on the semiconductor substrate. A photoresist is formed on the anti-reflection film. The anti-reflection film is partially removed using an opening formed by patterning the photoresist so as to expose an upper surface of the convex portion. The convex portion is etched using the photoresist and the anti-reflection film left in the concave portion. The anti-reflection film and the photoresist are removed, thereby obtaining the semiconductor substrate worked in a self-alignment manner.

5 Claims, 7 Drawing Sheets

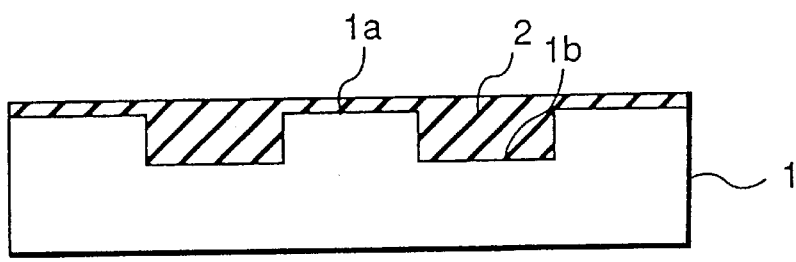
F I G. 1A
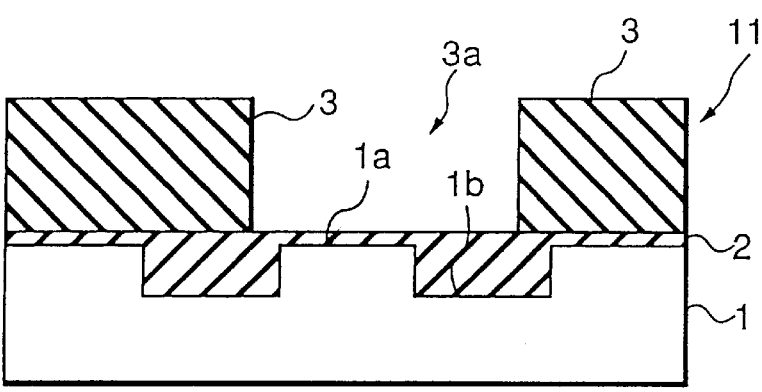
F I G. 1B
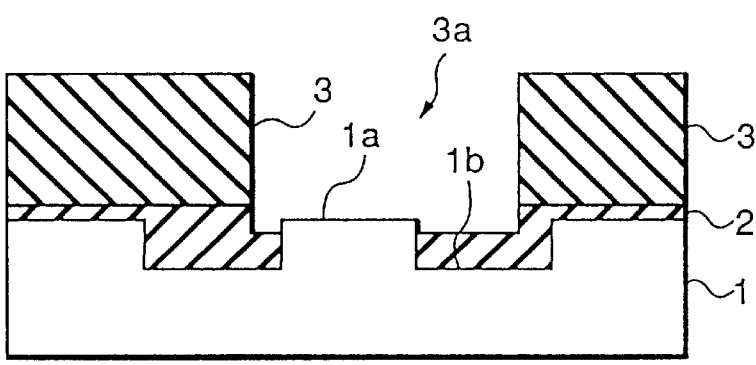
F I G. 1C
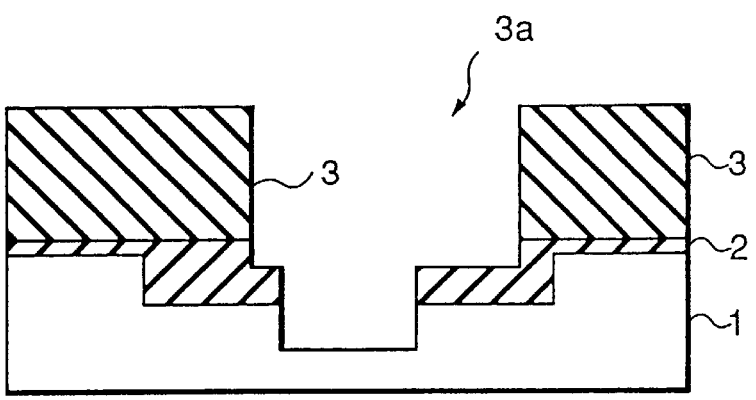
F I G. 1D
F I G. 1E

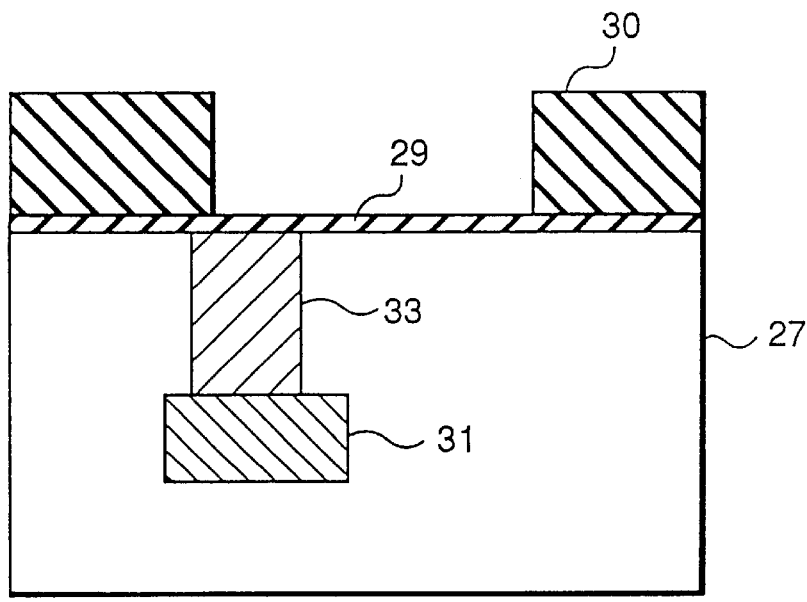
F I G. 9
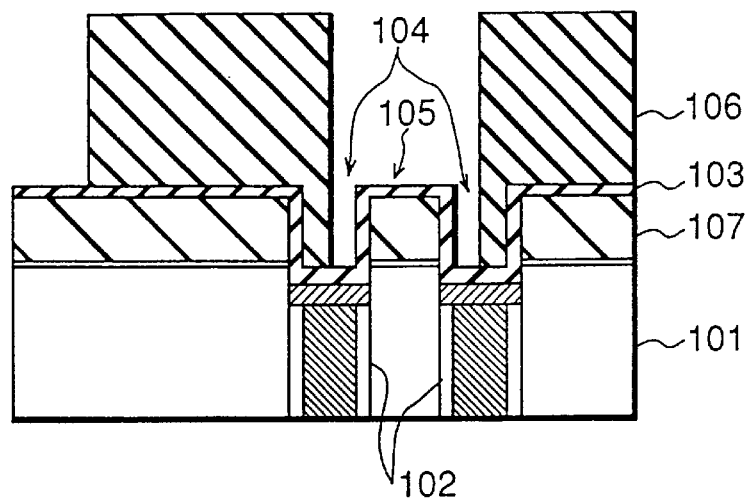
F I G. 10A
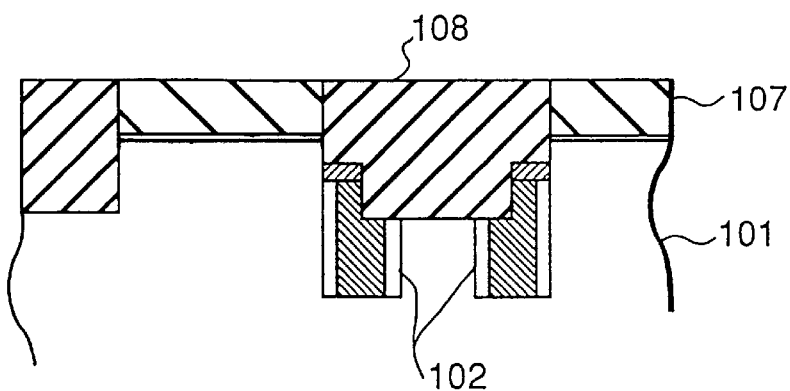
F I G. 10B

MANUFACTURING METHOD OF A SEMICONDUCTOR MEMORY DEVICE

BACKGROUND OF THE INVENTION

The present invention relates to a semiconductor memory device and a manufacturing method of the same, and more particularly to a dynamic type semiconductor memory device, such as a dynamic random access memory (DRAM) and a manufacturing method of the same.

In a photolithography step, in order to prevent a reflection from a base and to control a line width with a high accuracy, a process uses various kinds of anti-reflection films. Above all, a coating type anti-reflection film simplifies a formation process so that it may be widely used.

A surface of a base of a semiconductor substrate is not necessarily flat. Accordingly, patterning is sometimes performed on an uneven plane out of-necessity. FIGS. 10A and 10B are sectional views showing an example of formation steps of a conventional DRAM having a trench capacitor. For example, as shown in FIG. 10A, a conventional DRAM having a trench capacitor is formed, according to a well known method. After a trench capacitor 102 is formed in a semiconductor substrate 101 using a mask 107, an anti-reflection film 103 is coated. In this case, the surface of the substrate 101 where the trench capacitor 102 is formed includes a concave portion 104 and a convex portion 105, which is the portion surrounded by the concave portion 104. The anti-reflection film 103 is coated according to the unevenness on the surface of the substrate 101 serving as the base. Specifically, the anti-reflection film 103 is coated according to a step difference formed in an upper portion of the trench capacitor 102.

Thereafter, a photoresist Process is conducted to form an element separation layer, and further a mask material 107 and the substrate 101 are subjected to working, such as an etching, using a photoresist pattern 106 as a mask. The etching utilizes an etching rate difference between the mask material 107 and the substrate 101. Subsequently, as is shown in FIG. 10B, an element separation insulating film 108 is formed in the worked portion of the substrate 101.

However, the photoresist layer serving as the mask material is formed more thickly on the trench capacitor 102 than on other portions, according to the unevenness (formed by the concave and convex portions 104 and 105) due to the step difference in the upper portion of the trench capacitor which is formed on the surface of the substrate 101. For this reason, the conventional DRAM having the trench capacitor has a problem that a pattern resolution is deteriorated. Namely, the controllability for a pattern accuracy of an element isolation is deteriorated.

Furthermore, the anti-reflection film is thick at the step difference formed in the upper portion of the trench capacitor, depending on a material of the anti-reflection film. For this reason, in order to work the anti-reflection film which is thick, much of the photoresist is consumed. Therefore, the working for the base is cumbersome. This trend becomes more troublesome as micronization of the element size is promoted.

BRIEF SUMMARY OF THE INVENTION

From a viewpoint of the foregoing circumferences, the present invention was made. An object of the present invention is to provide a semiconductor memory device in which the controllability for a pattern accuracy of an element separation is not deteriorated and a working for a base is easy to perform not withstanding local uneven portions on a surface of a semiconductor substrate, and to provide a manufacturing method of the same.

A manufacturing method of a semiconductor memory device of the present invention comprises the steps of: a step for forming a first mask layer on a surface of a semiconductor substrate having local concave and convex portions for flattening the substrate; a step for removing the first mask layer formed on the convex portion of the semiconductor substrate; and a step for selectively working the convex portion using the first mask left in the concave portion as a mask.

In a manufacturing method of a semiconductor memory device of the present invention in which a trench is formed of a mask material formed on a semiconductor substrate, a diffusion layer is formed in a lower portion of the trench, a first filling layer is deposited on an inner wall of the trench, an oxide film and a second filling layer are deposited in an upper portion of the trench, and a third filling layer is deposited on the oxide film and the second filling layer, the improvement further comprising: a step for forming an element separation layer in a self-alignment with the first to third filling layers formed in the trench. A semiconductor memory device of a memory cell structure having a trench capacitor of the present invention comprises: a trench formed of a mask material worked on a semiconductor substrate; a diffusion layer, formed in the semiconductor substrate, by applying heat to an oxide film layer left at a lower portion of the trench; a first filling layer deposited on an inner wall of the trench; an oxide film formed in an upper portion of the trench; a second filling layer deposited in the upper portion of the trench as well as the inside of the oxide film; and a third filling layer deposited on the oxide film and the second filling layer, and an element separation layer formed in a self-alignment with the first to third filling layers formed in the trench.

According to the present invention, after the mask material on the convex portion in the semiconductor substrate is removed, the semiconductor substrate is worked utilizing the difference between the etching rates of the semiconductor substrate and the mask member buried in the concave portion of the semiconductor substrate, whereby the resist pattern can be made thin and a more micronized pattern can be formed. Moreover, since the convex portion having a different etching rate can be formed in a self-alignment with the concave portion formed in the semiconductor substrate, the formation of a pattern with more fineness is possible. Furthermore, when the present invention is applied to the memory cell having the trench capacitor, formation of the element separation layer in a self-alignment with the trench capacitor is possible, whereby a high integration of the memory cell also is possible. Still furthermore, since the trench filling structure can be kept invariable regardless of the mis-alignment of the trench pattern with the element separation pattern, a high manufacturing yield can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

For a more complete understanding of the present invention and the advantages thereof, reference is now made to the following description taken in conjunction with the accompanying drawings, in which;

FIG. 1A is a sectional view showing manufacturing processes of a semiconductor memory device according to a first embodiment of the present invention;

FIG. 1B is a sectional view showing manufacturing processes of a semiconductor memory device according to a first embodiment of the present invention;

FIG. 1C is a sectional view showing manufacturing processes of a semiconductor memory device according to a first embodiment of the present invention;

FIG. 1D is a sectional view showing manufacturing processes of a semiconductor memory device according to a first embodiment of the present invention;

FIG. 1E is a sectional view showing manufacturing processes of a semiconductor memory device according to a first embodiment of the present invention;

FIG. 9 is a sectional view showing a wiring process using a modification of the third embodiment of the present invention;

FIG. 10A is a sectional view showing an example of formation steps of a conventional DRAM having a trench capacitor; and FIG. 10B is a sectional view showing an example of formation steps of a conventional DRAM having a trench capacitor.

DETAILED DESCRIPTION OF THE INVENTION

Figure 2:
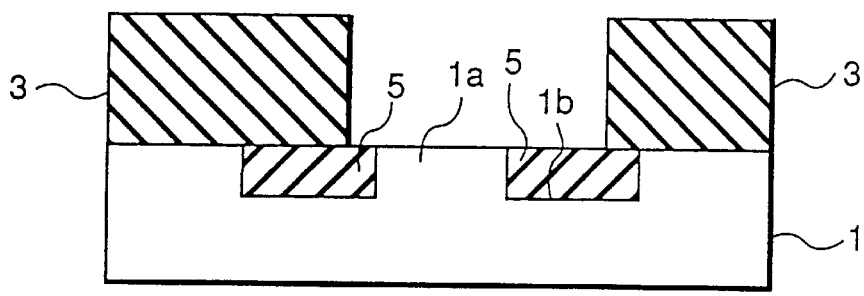
FIG. 2 is a sectional view showing a first modification of the first embodiment of the present invention.

Embodiments of the present invention will be described with reference to the accompanying drawings below.

FIGS. 1A to 1E are sectional views showing a manufacturing process of a semiconductor memory device according to a first embodiment of the present invention. Referring to FIG. 1A, a semiconductor device comprises a semiconductor substrate 1. A convex portion 1a and a concave portion 1b are formed locally on a surface of the semiconductor substrate 1. The semiconductor substrate 1 may be formed, for example, of silicon. An anti-reflection film 2 is formed as a coated film to serve as a first mask member and is formed by a first patterning on the surface of the semiconductor substrate 1 in which the convex and concave portions 1a and 1b are formed. The anti-reflection film 2 may be formed of an organic material, such as polysilane. The surface of the semiconductor substrate 1 is subjected to flattening. At this time, the thickness of the convex portion 1a ranges, for example, from 30 to 100 nm.

Subsequently, as shown in FIG. 1B, a photoresist 3 is formed on the anti-reflection film 2, and the photoresist 3 is patterned so that a resist opening portion 3a is formed on the anti-reflection film 2. In this patterning, the opening portion 3a is formed so that it surrounds the convex portion 1a of the semiconductor substrate 1. Then, as shown in FIG. 1C, the anti-reflection film (the first mask member) 2 is worked to expose an upper surface of the convex portion 1a of the semiconductor substrate 1.

Subsequently, as shown in FIG. 1D, using the anti-reflection film 2 left in the concave portion 1b of the semiconductor substrate 1 and the photoresist 3 as a first mask member, an etching working is conducted for the convex portion 1a of the semiconductor substrate 1, which is exposed. Thereafter, as shown in FIG. 1E, the anti-reflection film 2 and the photoresist 3 as the first mask member are removed, whereby the semiconductor substrate 1 is worked to obtain a shape as shown in FIG. 1E.

As a result of the foregoing processes, the convex portion 1a may be formed in a self-alignment with the concave portion 1b formed in the upper portion of the semiconductor substrate 1. The working for the semiconductor substrate according to the foregoing processes may provide such self-alignment by appropriately choosing the selection ratio of the materials. For example, a selection ratio of the semiconductor substrate 1 to the anti-reflection film 2 formed of the organic type coated film may be more than ten times. In other words, an etching rate difference more than ten times between the materials can be provided. If the mask material and the photoresist are selected under the condition that they have an opposite selection ratio to that, the convex portion 1a can be dug in a self-alignment manner.

FIG. 2 is a sectional view showing a first modification of the foregoing first embodiment of the present invention.

In the foregoing first embodiment, the anti-reflection film 2 serving as the first mask member is formed so as to be located on the entire upper surface of the semiconductor substrate 1. However, in the first modification to the first embodiment of the present invention as shown in FIG. 2, an anti-reflection film 5 may be formed only in a concave portion 1b, and not on the entire upper surface of the semiconductor substrate 1. After working, the first modification also can provide the same effect as the first embodiment which is shown in FIG. 1E.

Moreover, a material for the first mask member is not limited to an organic type coated film, but the first mask member may be an inorganic type coated film, such as spin-on-glass (SOG) and carbon.

FIGS. 3A to 3D are sectional views showing a second modification of the first embodiment of the present invention.

In this second modification, it is possible to obtain an inverted pattern of the concave portion by utilizing a difference of a thickness in the first mask member, without the second mask member (the photoresist).

Figure 3A:
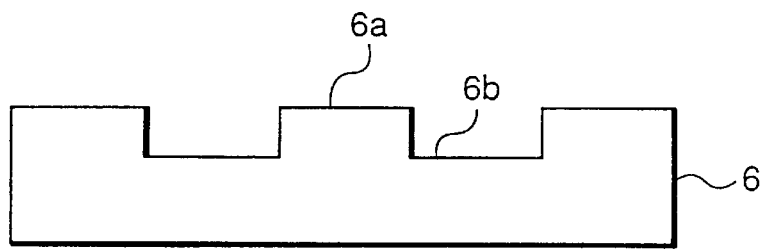
FIG. 3A is a sectional view showing a second modification of the first embodiment of the present invention.
Figure 3B:
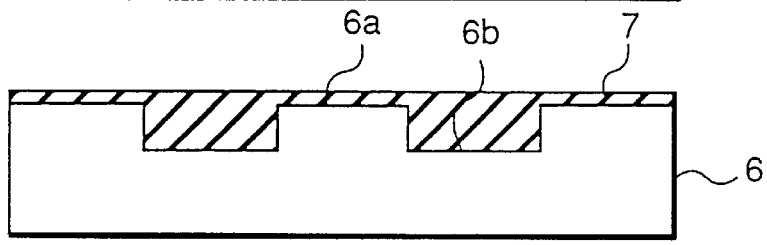
FIG. 3B is a sectional view showing a second modification of the first embodiment of the present invention.

Specifically, as shown in FIG. 3A, a convex portion 6a and a concave portion 6b are locally formed on a surface of a semiconductor substrate 6. As shown in FIG. 3B, an anti-reflection film 7 serving as a mask member is applied onto the semiconductor substrate 6 to thereby flatten the surface of the semiconductor substrate 6.

Figure 3C:
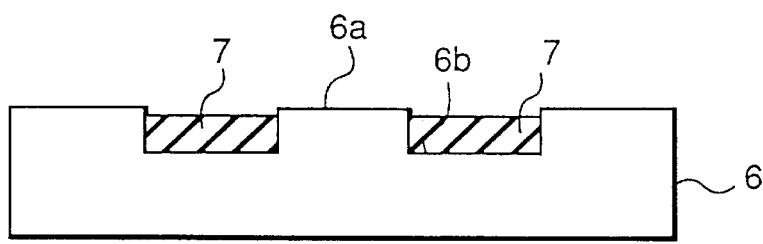
FIG. 3C is a sectional view showing a second modification of the first embodiment of the present invention.

Subsequently, as shown in FIG. 3C, a difference between the thickness of the portions of the anti-reflection film 7 respectively disposed in the convex and concave portions 6a and 6b in the semiconductor substrate 1 is utilized. Thus, as shown in FIG. 3C, the anti-reflection film 7 is worked so as to expose the upper surface of the convex portion 6a of the semiconductor substrate 1. The convex portion 6a is covered with a thinner portion of the anti-reflection film 7 and is exposed by utilizing the difference between the etching rates of the anti-reflection film 7 and the semiconductor substrate 1.

Figure 3D:
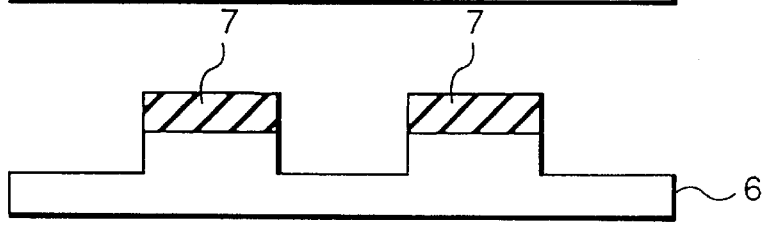
FIG. 3D is a sectional view showing a second modification of the first embodiment of the present invention.

Thereafter, as shown in FIG. 3D, using the anti-reflection film 7 remaining in the concave portion 6b of the semiconductor substrate 1 as a mask member, the portions of the semiconductor substrate 1 other than that in the concave portion 6b are worked, thereby obtaining the semiconductor substrate 1 as shown in FIG. 3D.

When the foregoing processes are applied to forming an element region of a DRAM cell, a pattern of an element region can be formed in a self-alignment with a trench capacitor, thereby achieving micronization of a memory cell.

Next, a second embodiment of the present invention is described with reference to the accompanying drawings, FIGS. 4, 5A to 5F, and 6A to 6E.

The second embodiment of the present invention is an example in which the processes disclosed in the description of the foregoing first embodiment of the present invention are applied to forming an element separation layer during manufacturing processes of a DRAM having a trench capacitor.

Figure 4:
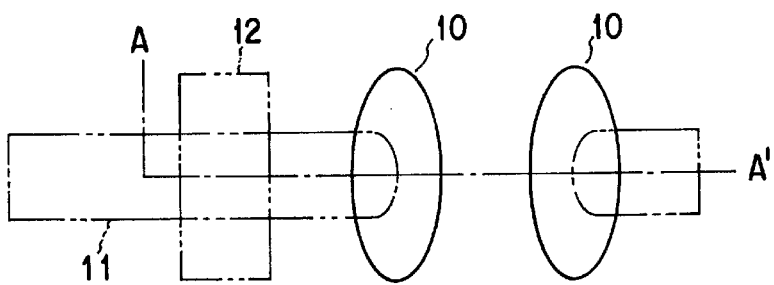
FIG. 4 is a plan view of a DRAM having a trench capacitor according to a second embodiment of the present invention, wherein the processes of the first embodiment are applied to forming an element separation layer.

FIG. 4 is a plan view of such a DRAM, and FIGS. 5A to 5F are sectional views illustrating formation processes of the trench capacitor of the DRAM. FIGS. 6A to 6E are sectional views taken along the line A—A of FIG. 4, showing the process of forming an element separation layer after the formation of the trench capacitor.

Referring to FIG. 4, an element region 11 is to be formed on a trench capacitor 10 as shown in FIG. 4. Moreover, a gate electrode 12 is to be provided in a predetermined position of the element region 11.

The formation steps of the trench capacitor are described with reference to FIGS. 5A to 5F.

It should be noted that the formation steps of the trench capacitor are well known in the art and they are disclosed, for example, in IEDM, 1994, VLSI symposium, 1995, the subject matter of which is incorporated herein by reference.

Figure 5A:
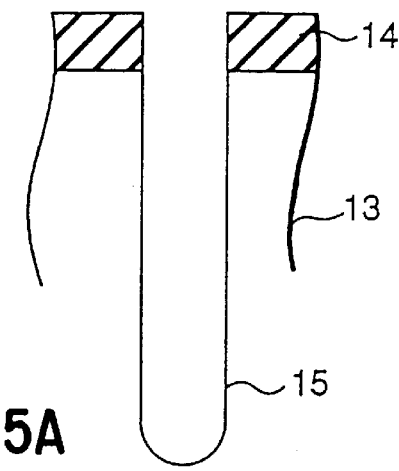
FIG. 5A is a sectional view showing processes for forming the trench capacitor of the DRAM of FIG. 4.

First, referring to FIG. 5A, a mask member 14 is formed on a semiconductor substrate 13 using a resist pattern. The mask member 14 may be, for example, a hard mask, and may be formed of, for example, SiN. The semiconductor substrate 13 may be formed, for example, of P-type semiconductor. Thereafter, a trench 15 having a U—cross sectional shape is formed by a well known reactive ion etching (RIE) method, using the mask member 14 as a mask.

Figure 5D:
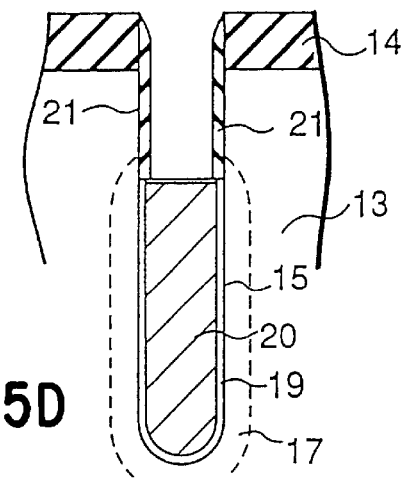
FIG. 5D is a sectional view showing processes for forming the trench capacitor of the DRAM of FIG. 4.
Figure 5B:
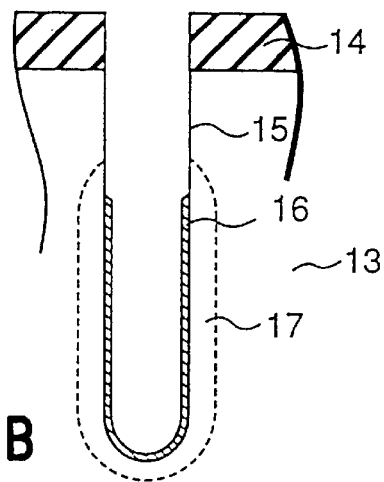
FIG. 5B is a sectional view showing processes for forming the trench capacitor of the DRAM of FIG. 4.

Subsequently, as shown in FIG. 5B, an oxide film 16 is formed only at a lower portion of the trench 15 for a capacitor. The oxide layer 16 may selectively contain either arsenic (As) glass or phosphorus (P) glass. An n-type diffusion layer 17 is formed in the semiconductor substrate by performing a thermal processing, such as heating an oxide film, and functions as a plate electrode of the capacitor formed in the semiconductor substrate 1. As a matter of course, the conductivity type of the diffusion layer 17 may be an n+ or n− type. Thereafter, the solid phase diffusion source that is the oxide layer 16 is removed.

Figure 5E:
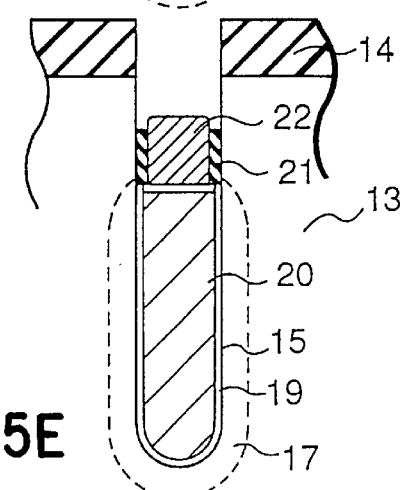
FIG. 5E is a sectional view showing processes for forming the trench capacitor of the DRAM of FIG. 4.
Figure 5C:
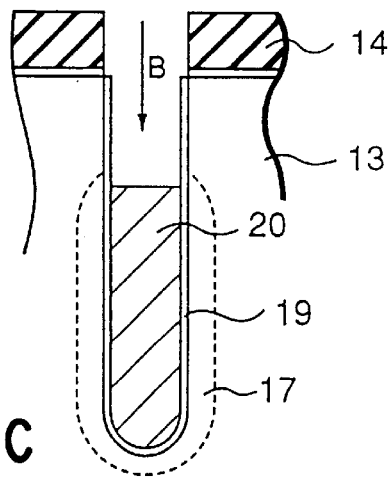
FIG. 5C is a sectional view showing processes for forming the trench capacitor of the DRAM of FIG. 4.

Then, as shown in FIG. 5C, a capacitor insulating film 19 is formed on an inner wall of the trench 15, and may be, for example, an NO film. A first filling layer 20, such as an n+-type polysilicon layer, is deposited in the trench 15. Thereafter, the first filling layer 20 is subjected to an etch-back so that the layer 20 is depressed below the surface of the semiconductor substrate 1, as shown by the arrow B in FIG. 5C.

In FIG. 5D, in order to prevent formation of a parasitic transistor, an oxide film 21 is formed on the upper portion of the trench 15 by a side wall leaving step.

Next, as shown in FIG. 5E, a second filling layer 22 such as an N+-type polysilicon is deposited on the first filling layer 20 in the trench 15. The surface of the second filling layer 22 is depressed below the surface of the semiconductor substrate 13 by a step performed in the same manner for the first filling layer 20. Then, the upper portion of the oxide 21 located on the side wall of the trench 15 is removed by a process such as a wet etching.

Figure 5F:
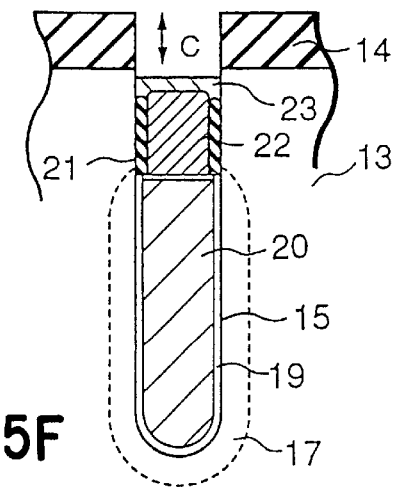
FIG. 5F is a sectional view showing processes for forming the trench capacitor of the DRAM of FIG. 4.

Moreover, in FIG. 5F, a third filling film 23, such as an n+-type polysilicon, is deposited on the top surface of the first and second filling layers 20 and 22, respectively. The surface of the third filling film 23 is depressed below the surface of the semiconductor substrate 13 by the same steps for the first and second filling layers 20 and 22, which are described above. The depth of the depression of the surface of the third filling film 23 is equal to the step difference shown by the arrow C in FIG. 5F.

As a result, the diffusion layer 17 may be a storage electrode, the third filling layer 23 may be a connection electrode of a transfer transistor, and the first and second filling layers 20 and 22 may be plate electrodes.

The formation of an element separation layer on a DRAM having the trench capacitor, which is formed in the foregoing manner, is described with reference to FIGS. 6A to 6E.

Figure 6A:
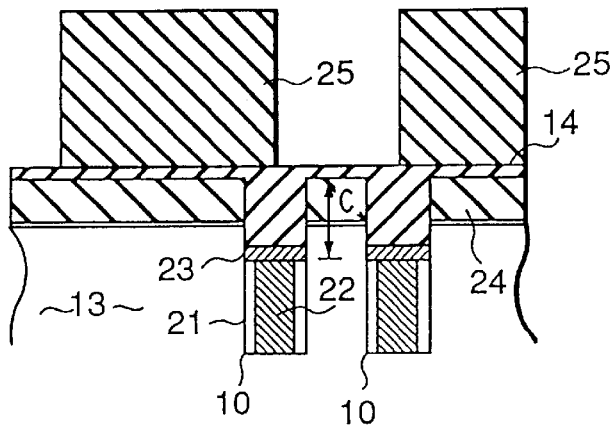
FIG. 6A is a sectional view showing the processes of forming an element separation layer for a trench capacitor, taken along the line A—A of FIG. 4, according to the third embodiment of the present invention.

As shown in FIG. 6A, a mask member 24 and an anti-reflection film 14 are formed on the semiconductor substrate 13 in a manner described above.

A photoresist 25 is patterned with an opening portion for working the layers above the trench capacitor.

The step difference shown by the arrow C is produced between the third filling layer 23, which is located inside the trench capacitor 10, and a mask member 24 at the time of working. The step difference C buries the anti-reflection film 14 that is the first mask member. When the anti-reflection film 14 has a flat surface, patterning the photoresist 25 may be performed easily for the opening portion, which includes at least the convex portion of the trench capacitor 10.

Figure 6B:
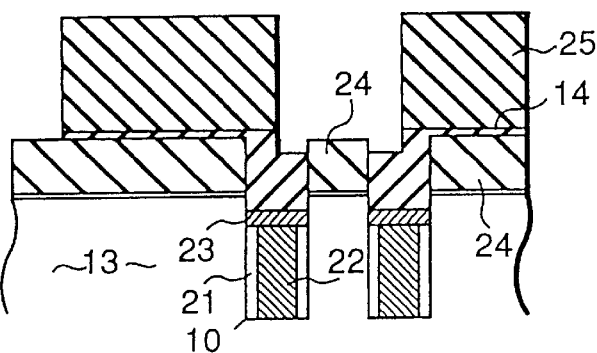
FIG. 6B is a sectional view showing the processes of forming an element separation layer for a trench capacitor, taken along the line A—A of FIG. 4, according to the third embodiment of the present invention.

Subsequently, as shown in FIG. 6B, the anti-reflection film 14 is selectively etched using the mask member 24 as a mask to expose the upper surface of the mask member 24.

Figure 6C:
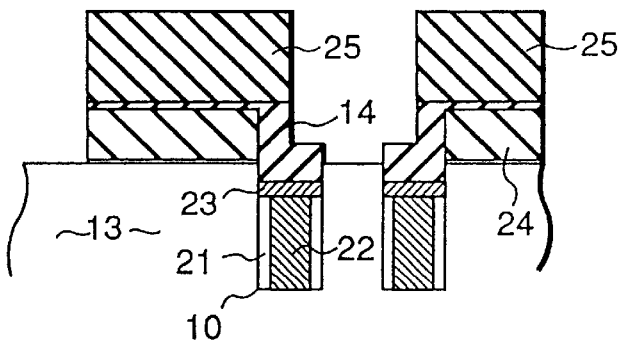
FIG. 6C is a sectional view showing the processes of forming an element separation layer for a trench capacitor, taken along the line A—A of FIG. 4, according to the third embodiment of the present invention.
Figure 6D:
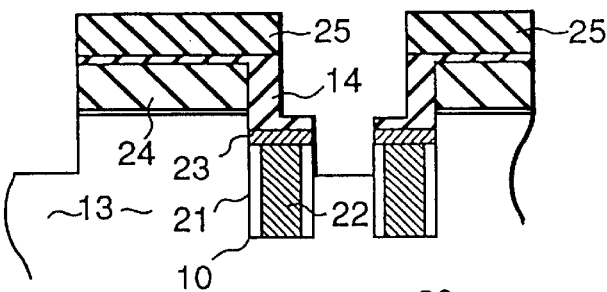
FIG. 6D is a sectional view showing the processes of forming an element separation layer for a trench capacitor, taken along the line A—A of FIG. 4, according to the third embodiment of the present invention.
Figure 6E:
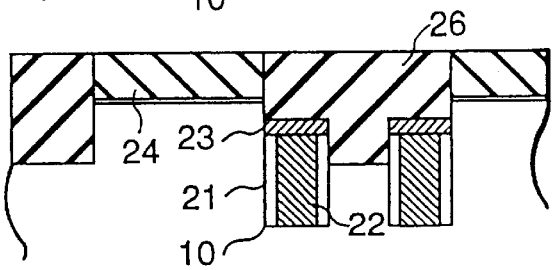
FIG. 6E is a sectional view showing the processes of forming an element separation layer for a trench capacitor, taken along the line A—A of FIG. 4, according to the third embodiment of the present invention.

Then, as shown in FIG. 6C, the working for the mask member 24 surrounding the trench capacitor 10 is performed. Using the first mask member 14 (the anti-reflection film) as a mask, the first mask member 14 is left on the upper portion of the trench capacitor 10. Subsequently, as shown in FIG. 6D, the semiconductor substrate 13 is worked. The working for the semiconductor substrate 13 is an etching working for an element separation, which is an etching for etching Si with a selection ratio for the anti-reflection film 14. After the photoresist 25 and the fist mask member 14 are removed, as shown in FIG. 6E, a chemical vapor deposition (CVD) insulating film 26 is deposited in the position worked in the foregoing process, and operates as an element separation layer. The resultant structure is subjected to a flattening treatment by, for example, a Chemical Mechanical Polishing (CMP), whereby the insulating film 26 for the element separation is left in the concave portion surrounded by the mask member 24.

Figure 7A:
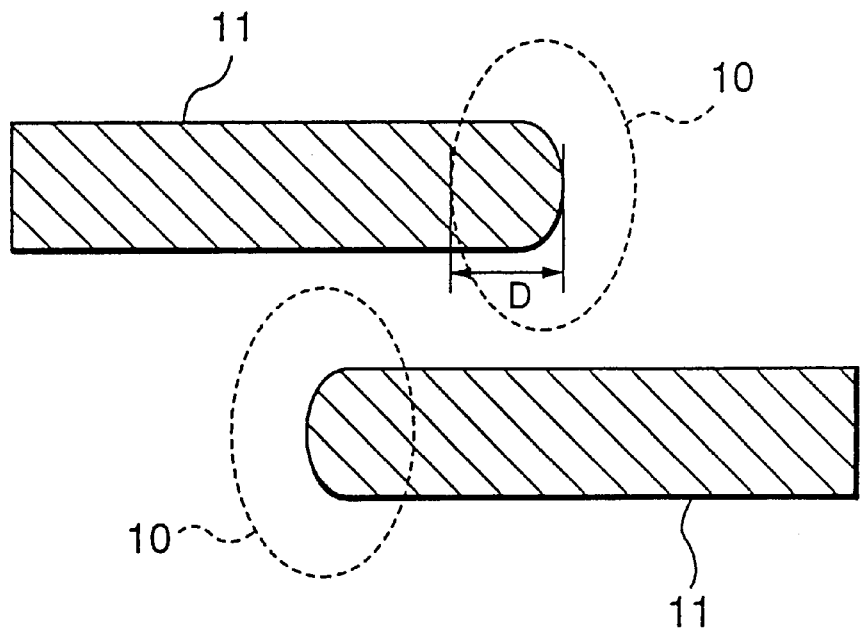
FIG. 7A is a plan view of a DRAM showing a margin in aligning an element separation pattern with the trench capacitor.
Figure 7B:
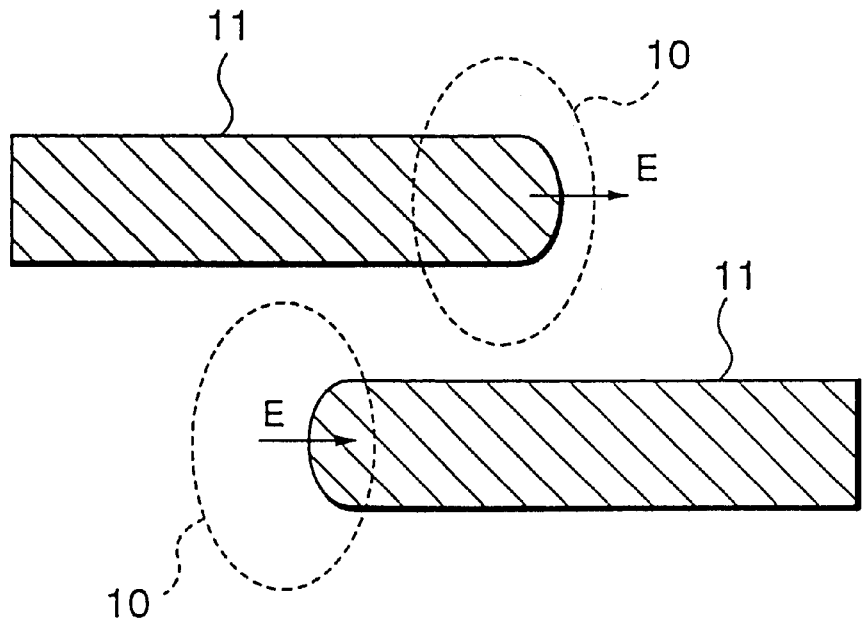
FIG. 7B is a plan view of a DRAM showing a margin in aligning an element separation pattern with the trench capacitor.

FIGS. 7A and 7B are plan views showing a margin in aligning an element separation pattern with a trench capacitor. By performing the above-described processes, since the anti-reflection film 14 having a different etching rate is made thicker on the trench, the insulating film 26 for an element separation is automatically protected against the trench capacitor 10 in the upper portion of the trench. For this reason, as shown in FIGS. 7A and 7B, even when a mis-alignment of the element separation pattern 11 with respect to the trench capacitor 10 is produced, the shape of the trench is made invariable. It should be noted that the arrow D in FIG. 7A shows a margin in aligning the element separation pattern 11 with the trench capacitor 10, and the arrow E in FIG. 7B shows the direction of the mis-alignment.

Moreover, it is unnecessary to require the alignment margin so that it is possible to micronize the memory cell.

Next, a third embodiment of the present invention is described. FIGS. 8A to 8D are sectional views illustrating manufacturing steps of an example in which the foregoing processes are applied to wiring steps according to a third embodiment of the present invention.

Figure 8A:
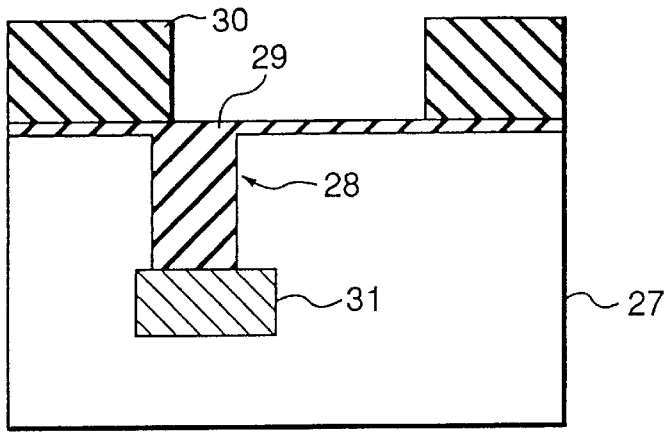
FIG. 8A is a sectional view showing a wiring process that uses the process of the first embodiment according to a third embodiment of the present invention.

First, as shown in FIG. 8A, a contact 31 is formed in a substrate 27. After a contact hole 28 is formed in the semiconductor substrate 27, a first mask member 29 is deposited on the entire surface of the semiconductor substrate 27 so as to fill the contact hole 28 with the first mask member 29. The resultant structure is subjected to a flattening treatment, in the same manner as the foregoing first and second embodiments. Subsequently, a photoresist 30 is formed on a flat surface of the first mask member 29, and then the photoresist 30 is patterned so that a wiring pattern having an opening portion is produced. At this time, the left edge of the opening portion is located at the position on the contact hole 28 shown in FIG. 6A, in other words, the opening portion is provided at a position to include at least the contact hole 28.

Figure 8B:
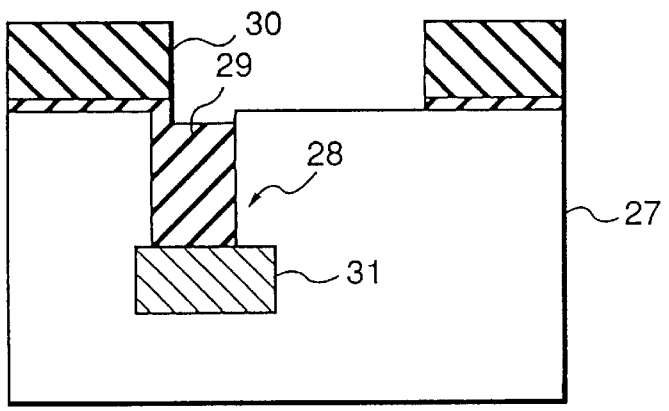
FIG. 8B is a sectional view showing a wiring process that uses the process of the first embodiment according to a third embodiment of the present invention.
Figure 8C:
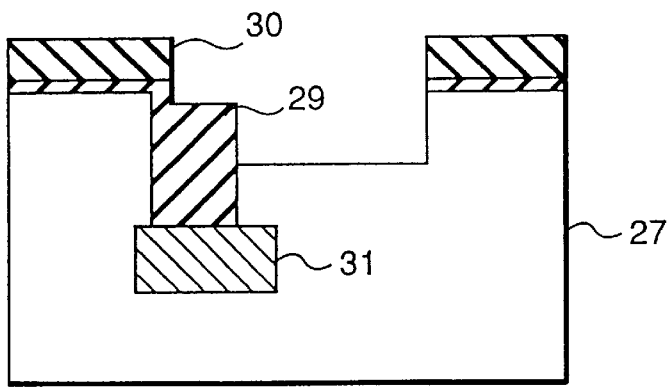
FIG. 8C is a sectional view showing a wiring process that uses the process of the first embodiment according to a third embodiment of the present. invention.

Subsequently, as shown in FIG. 8B, the working for the first mask member 29 is performed so as to expose the upper surface of the semiconductor substrate 27, as well as the portion of the first mask member 29 buried in the contact hole 28. Moreover, as shown in FIG. 8C, using the first mask member 29 and the photoresist 30 as a mask, the working for the semiconductor substrate 27 is conducted.

Figure 8D:
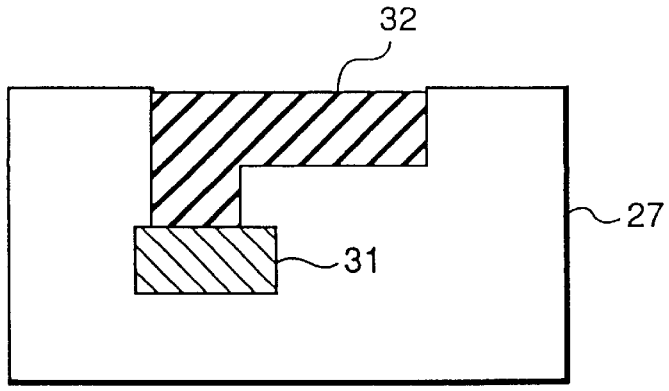
FIG. 8D is a sectional view showing a wiring process that uses the process of the first embodiment according to a third embodiment of the presentinvention.

Thereafter, the first mask member 29 and the photoresist 30 are removed. As shown in FIG. 8D, a wiring pattern 32 is formed at the portion provided after passing through the processes shown in FIGS. 8A to 8C. Finally, the first mask member 29 and the photoresist 30 are removed, and the wiring member 32 is buried at a concave portion produced by removing the first mask member 29 and the photoresist 30, whereby the memory cell is completed.

In the third embodiment of the present invention, while protecting the inside of the hole pattern 28 previously formed, an over-etching of the left edge of the contact hole 28 due to the mis-alignment of the mask can be prevented and the wiring pattern can be formed.

FIG. 9 is a sectional view showing a modification of the third embodiment of the present invention. A contact hole 33 may be previously filled with a filling material different from that of the anti-reflection film 29. Such filling material may be, for example, SOG and carbon.

Although the preferred embodiments and the modifications of the present invention have been described in detail, it should be understood that various changes, substitutions and alternatives can be made thereto without departing from the spirit and scope of the present invention as defined by the appended claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:

forming a first mask layer which is formed of disposable material on a surface of a semiconductor substrate having concave and convex portions to make the surface thereof flat;

forming a plurality of stacked photoresist layers on said first mask layer, and patterning said stacked photoresist layers;

removing said first mask layer disposed on the convex portion of said semiconductor substrate using said stacked photoresist layers as a mask; and selectively etching said convex portion using said first mask layer left in the concave portion of said semiconductor as a mask.

2. In a manufacturing method of a semiconductor memory device of a memory cell structure having a pair of trench capacitors disposed in a spaced apart relation, each trench capacitor including a trench formed of a mask material worked on a semiconductor substrate, a diffusion layer disposed at a lower portion of the trench, a first filling layer deposited on an inner wall of said trench, a second filling layer and an oxide film each deposited on an upper portion of said trench, and a third filling layer deposited on said oxide film and said second filling layer, the improvement comprising:

forming a first mask layer on a surface of a semiconductor substrate having said pair of capacitors to make the surface thereof flat;

removing said first mask layer disposed on a convex portion of said semiconductor substrate between said pair of capacitors; and selectively etching said convex portion using said first mask layer left in the trenches of said capacitors as a mask.

3. The method of claim 1 further comprising the step of forming an element separation layer in a self-alignment with said first to third filling layers formed in said trenches of said capacitors.

4. A method for manufacturing a semiconductor device, comprising the steps of:

forming a first mask layer which is formed of disposable material on a surface of a semiconductor substrate having concave and convex portions to make the surface thereof flat;

removing said first mask layer disposed on the convex portion of said semiconductor substrate; and selectively etching said convex portion using said first mask layer left in the concave portion of said semiconductor as a mask, wherein said first mask layer is removed following said selectively etching step.

5. A method for manufacturing a semiconductor memory device of a memory cell structure having a pair of trench capacitors disposed in a spaced apart relation, said pair of trench capacitors being refilled with a filling layer or filling layers, with an insulating film on a trench-side surface interposed therebetween, and an upper surface of said filling layer or layers forming a concave surface in a wafer which includes a mask member, before an element separation layer is formed, the improvement comprising:

forming a first mask layer on a surface of a semiconductor substrate having said pair of capacitors to make the surface thereof flat;

removing said first mask layer disposed on a convex portion of said semiconductor substrate between said pair of capacitors; and selectively etching said convex portion using a portion of said first mask layer left in the trenches of said capacitors as a mask.

* * * * *